(12) United States Patent
Singh et al.

(10) Patent No.: US 6,355,340 B1
(45) Date of Patent: Mar. 12, 2002

(54) LOW EXPANSION METAL MATRIX COMPOSITES

(75) Inventors: Jai R. Singh, Shelton, CT (US); Clarence A. Andersson, Wallingford, PA (US)

(73) Assignee: M Cubed Technologies, Inc., Monroe, CT (US)

( * ) Notice: Subject to any disclaimer, the term of this patent is extended or adjusted under 35 U.S.C. 154(b) by 0 days.

(21) Appl. No.: 09/378,367

(22) Filed: Aug. 20, 1999

(51) Int. Cl.$^7$ ................................................. B32B 9/00
(52) U.S. Cl. ................................ 428/312.8; 428/304.4; 428/311.51; 428/312.2
(58) Field of Search ........................... 428/292.1, 293.1, 428/294.1, 296.1, 296.4, 307.3, 307.7, 428, 304.4, 311.51, 312.2, 312.8

(56) References Cited

U.S. PATENT DOCUMENTS

| | | |
|---|---|---|
| 3,571,901 A | 3/1971 | Sara |
| 3,766,000 A | 10/1973 | Gibson et al. |
| 3,807,996 A | 4/1974 | Sara |
| 3,994,867 A | 11/1976 | Baughman et al. |
| 4,056,874 A | 11/1977 | Kalnin |

(List continued on next page.)

OTHER PUBLICATIONS

William E. Davis, "Affordable, High Performance Composites", 1996 Air Force Phase II SBIR Award (abstract only).
Mark J. Montesano, "Thermal Management for Advanced 3D Packaging of Payload Electronics", 1999 Air Force Phase I SBIR Award (abstract only).
"BP Amoco Chemicals—Carbon Fibers", selected pages (9) from website www.bpamococarbonfibers.com, Copyright 2000 BP Amoco plc.
Jana L. Jackson, "Graphite Reinforced Magnesium as an Alumina Matching Low Coefficient of Thermal Expansion Material", 1987 Navy Phase I SBIR Award (abstract only).
Uday Kalishalikar, "Pressure Casting for Producing Thin Walled Zero CTE Gr/Mg Space Structural Joints", 1990 BMDO Phase II SBIR Award (abstract only).
Uday Kalishalikar, "Graphite–Magnesium, Metal–Matrix Composites for Space Structural Joints with Built–In Metallic Inserts", 1991 NASA Phase I SBIR Award (abstract only).
Max L. Lake, "Diamond Fibers for Heat Sinks*Diamond Fibers for Thermal Energy Management", 1991 BMDO Phase I SBIR Award (abstract only).
Uday Kalishalikar, "Lightweight Graphite–Aluminum Space Radiators for Thermal Management", 1992 NASA Phase I SBIR Award (abstract only).
William De La Torre, "Recent Advances in Composites for Electronic Packaging", 1993 Navy Phase I SBIR Award (abstract only).
William De La Torre, "Recent Advances in Composites for Electronic Packaging", 1995 Navy Phase II SBIR Award (abstract only).

*Primary Examiner*—Rich Weisberger
(74) *Attorney, Agent, or Firm*—Jeffrey R. Ramberg

(57) ABSTRACT

A low to near-zero metal matrix composite material featuring high modulus carbon fibers reinforcing a lightweight metal or semimetal. The fibers have a negative coefficient of thermal expansion in the axial direction. Laminates featuring parallel arrays of fibers may be cross-plied to produce quasi-isotropic properties in the composite body. The CTE of the composite body depends not only upon the relative CTE's of the fibers and matrix, and their relative amounts (e.g., loadings), but also upon the relative elastic moduli of the fibers and matrix. By intentionally introducing porosity into the matrix, the elastic modulus of the matrix is reduced, and thus the CTE of the composite body is influenced more by the CTE contribution of the fibers. In effect, the composite CTE is shifted toward that of the fibers, which shifting represents a reduction in composite CTE. Hydrogen outgassing upon solidification of the metallic matrix is one technique for producing such porosity.

23 Claims, 2 Drawing Sheets

U.S. PATENT DOCUMENTS

| | | | |
|---|---|---|---|
| 4,083,719 A | * | 4/1978 | Arakawa et al. |
| 4,157,409 A | | 6/1979 | Levitt et al. |
| 4,376,803 A | | 3/1983 | Katzman |
| 4,451,118 A | | 5/1984 | Stalcup et al. |
| 4,791,076 A | | 12/1988 | Leggett et al. |
| 4,806,704 A | | 2/1989 | Belke, Jr. et al. |
| 4,828,008 A | | 5/1989 | White et al. |
| 5,330,807 A | | 7/1994 | Williams |
| 5,834,115 A | | 11/1998 | Weeks, Jr. et al. |

* cited by examiner

LOW EXPANSION METAL MATRIX COMPOSITES

BACKGROUND OF THE INVENTION

1. Field of the Invention

The present invention relates to composite materials having a low coefficient of thermal expansion (CTE). In particular, the invention relates to metal matrix composites (MMC's) possessing high thermal conductivity and low, preferably near-zero CTE's.

2. Discussion of Related Art

It has been known for a long time to add fibrous reinforcement to metals to increase mechanical properties such as specific strength and specific stiffness. One of the early such reinforcements was carbon or graphite fiber, produced from polymeric precursors. The resulting composite material offered double or triple the strength or stiffness compared to the bulk, unreinforced metal. Processing was difficult, however, as the metals either tended not to wet the carbon fibers, or reacted with the carbon. Considerable energy has been devoted to developing ways to preserve the chemical and physical integrity of the fibers while rendering them more chemically compatible with the metal matrix.

Carbon fibers can be manufactured with high degrees of anisotropy. The graphite form of carbon in particular features a hexagonal crystallographic structure, with the covalent bonds within the {001} planes being strong, and the bonds between the {001} planes consisting of weak van der Waals bonds. It is possible to preferentially align the crystallographic planes in a graphite fiber such that the {001} planes tend to be parallel to the graphite fiber axis. By increasing the relative amount of covalent bonds in the fiber axis direction, a fiber possessing high strength and high elastic modulus in the direction of the fiber axis is produced. An interesting phenomenon that accompanies the alignment of the high strength, high modulus directions is that this particular direction also possesses a (rare) negative CTE. Thus, instead of expanding upon heating like most materials, these fibers actually shrink in the axial direction. In the radial direction of such fibers, however, the strength and elastic moduli are relatively low and the CTE is positive and relatively high.

By incorporating parallel arrays of such fibers into a positive CTE isotropic matrix, a composite material having a high modulus and a zero or near-zero CTE in the axial direction of the fibers can be produced. In the direction transverse to the fiber axes, the modulus would be relatively low and the CTE would be relatively high. Because of the axial stiffness, the properties of the composites tend to be dominated by the axial properties.

The degree of anisotropy can be reduced by distributing the fiber orientations. One technique for accomplishing this is to arrange the fibers in parallel within a thin sheet or "ply", and to place a number of such plies on top of one another such that fibers in one ply are skew with respect to fibers in an adjacent ply. With suitable arrangements of the plies it is possible to produce quasi-isotropic sheet materials. Quasi-isotropic lay-ups of thin plies of the composite can be achieved by orienting successive plies at 0°, +45°, −45° and 90°; or 0°, +60° and −60° with respect to the fiber axes. The distribution of the fiber directions, however, significantly reduces the CTE influence of the fibers (as will be illustrated later); thus, it becomes that much more difficult to produce composites that have zero or near-zero CTE's in the dominant plane of the composite.

U.S. Pat. No. 3,807,996 to Sara teaches a carbon fiber reinforced nickel matrix composite material. Sara discloses the use of high strength, high modulus carbon fibers, as well as various geometrical arrangements of the fibers, such as arrays (plates) of parallel fibers and cross-plies (laminates) of such arrays.

U.S. Pat. No. 4,083,719 to Arakawa discloses a carbon fiber reinforced copper composite featuring a low thermal expansion coefficient and no directional characteristic of the mechanical properties.

U.S. Pat. No. 4,157,409 to Levitt et al. discloses treating carbon fibers with molten NaK to permit wetting by molten aluminum, magnesium, copper, zinc, tin or lead matrix metals.

U.S. Pat. No. 5,834,115 to Weeks, Jr. et al. discloses protecting carbonaceous reinforcement materials such as fibers with molybdenum carbide and then infiltrating with a molten metal to produce a composite body. A woven fabric of coated graphite fibers reinforcing a copper matrix exhibited a CTE between about 4 and $7\times10^{-6}$ cm/cm per degree K (hereinafter conveniently referred to as "parts per million per degree Kelvin" or ppm/K).

High modulus carbon fibers have also been incorporated into polymeric matrices. U.S. Pat. No. 5,330,807 to Williams discloses a composite laminated tubing intended for offshore oil extraction operations. There the problem was the need to transfer oil in a tube over appreciable distances and in which the tube may undergo considerable temperature excursions due to the elevated temperature of the extracted oil. To minimize the expansion of the tube length and thereby ameliorate the propensity for the tube to fail by buckling, the tubing is made of a plurality of layers of fibers fixed in a plastic matrix. The fibers may be graphite fibers, glass fibers, ceramic fibers or polymer fibers, but in any case the fibers have a sufficiently low CTE as to impart to the tubing an overall CTE of no more than about 1.1 ppm/K, and a Poisson's ratio near 0.5.

In many environments, however, polymer matrix composites cannot be used because of insufficient resistance to extremes of temperature, corrosion or radiation. Accordingly, some workers have used glass as the matrix material. Glass has several attractive properties for these types of materials, including fluidity or flowability, wettability to the fibers and the potential for relatively low CTE's. For a laser mirror application, for example, Stalcup et al. (U.S. Pat. No. 4,451,118) hot pressed a mixture of a low expansion borosilicate glass and alternating plies of high modulus graphite fibers. Some of the graphite fibers were arranged perpendicular to the reflecting surface so as to be better able to conduct heat away from the mirror surface. Still, cooling passages had to be placed into the mirror structure to permit circulation of a heat exchange fluid. Similarly, in U.S. Pat. No. 4,791,076 Leggett et al. discloses a graphite fiber silica matrix composite composition having a near-zero overall CTE. In addition to silica, the matrix contains boron phosphate and beta-spodumene, and Leggett states that the composite CTE is tailorable between −1 and +1 ppm/K by varying the matrix composition. As a consequence of the low CTE, very little thermal distortion occurred in for example, a laser mirror application, particularly at low coolant flow rates. This glass matrix composite material exhibited much less thermal distortion than did other laser mirror materials such as single crystal molybdenum or silicon. Although the cooling requirements were reduced, active cooling techniques involving heat transfer media flowing through channels in the mirror still were required.

As mentioned above, glass matrix composites have been used in environments where low expansion polymer composites would be insufficiently durable. Many of these applications, however, require high thermal conductivity, and most glasses are deficient in this area. Thus, composites workers have attempted to address the thermal conductivity problem by relying on the carbon fibers to carry this responsibility, the carbon fibers possessing relatively high thermal conductivity in the fiber axis direction. Another problem with glass matrix composites, though, is that they tend to be brittle. In many applications in which such composites are subjected to accelerations and stresses, such as with semiconductor fabrication equipment, it would be preferable to have a tougher, more impact resistant material.

A number of metals are intrinsically highly thermally conductive and tough, and possessing low specific gravity and sufficient durability in harsh environments as to make them candidates for aerospace or precision equipment applications. Unfortunately, these metals suffer from having relatively high CTE's—typically around 20 ppm/K or higher. There seem to be no successes or even proposals to make composites using these high modulus carbon fibers as the reinforcement of a light metallic matrix for the express purpose of producing very low CTE metal matrix composites. The lowest CTE achieved for such MMC's appears to be the 4 ppm/K of U.S. Pat. No. 4,083,719, which represents work done years ago. While quite low in comparison to unreinforced metals, there are applications, such as in optical systems that undergo temperature fluctuations, where even lower CTE's would be desirable.

SUMMARY OF THE INVENTION

Thus, in view of the present state of composites development, it is an object of the present invention to produce a metal matrix composite material that exhibits a low CTE, and particularly a near-zero CTE, preferably in a quasi-isotropic condition.

It is an object of the present invention to produce a material having a relatively high thermal conductivity.

It is an object of this invention to produce a material that can maintain its structural integrity at higher temperatures than can polymeric materials.

It is an object of this invention to produce a material that is more resistant to the effects of radiation than are polymers.

It is an object of this invention to produce low expansion composite materials that are tougher and/or more impact resistant that glass matrix composites.

These and other objects of the present invention are achieved by reinforcing a lightweight metal or semimetal such as aluminum, magnesium, copper, silicon or one of their alloys, with a fibrous reinforcement having a negative CTE in the axial direction. Because the CTE of the matrix is positive while that of the fibers is negative, the individual contributing CTE's tend to cancel one another. Because of this counterbalancing or offset effect, it is theoretically possible to engineer a metal matrix composite material, or a composite material of any matrix, for that matter, to have a net overall CTE of zero.

The inventors recognize, however, that the CTE of the composite body is also influenced by the elastic modulus of the individual composite constituents. Given the high CTE and elastic modulus of some candidate matrix metals, it is for all practical purposes impossible to achieve sufficiently high fiber loadings to counterbalance this "adverse influence" of such matrix metals, in spite of the fact that the negative CTE fibers usually also possess very high elastic modulus.

Significantly, the inventors appreciate that the lower the modulus of the matrix relative to the fibers, the more that the CTE of the composite is influenced by the CTE of the fibers. Accordingly, by introducing voids or porosity into the matrix, the elastic modulus of the matrix may be decreased, thereby shifting the composite CTE further toward that of the fibers. The important point is that the direction of the change in composite CTE is toward zero. One such technique for introducing such porosity is by dissolving hydrogen gas into a melt of the metal that is to be the matrix, and causing the gas to come out of solution as bubbles upon solidification of the metallic matrix. Another is to incorporate one or more filler materials comprising hollow bodies into the composite.

DETAILED DESCRIPTION OF THE INVENTION

According to the present invention, a lightweight metal or semimetal such as aluminum, magnesium, silicon or one of their alloys, or a high thermal conductivity metal or alloy thereof such as copper or silver, is reinforced with a high elastic modulus fibrous reinforcement. In spite of the rather high CTE's of matrix metals such as aluminum and magnesium, such metals may be used as the matrix materials to produce low expansion composites. That this is so is because the inventors recognize that the overall CTE of the composite is affected not only by the respective CTE's of reinforcement and matrix phases and the volume fraction of each, but also by the respective elastic moduli. More specifically, the inventors appreciate that the lower the elastic modulus of the matrix relative to the fibers, the more that the CTE of the composite is dominated by the CTE of the fibers. The elastic modulus of the matrix may be engineered (e.g., decreased) by introducing voids or porosity into the matrix, thereby causing the overall CTE of the composite material to trend toward that of the fibers. High elastic modulus graphite fibers often have a negative CTE along the fiber axis. This phenomenon is significant because the direction of this trend is toward zero net CTE. One such technique for introducing such porosity is by dissolving hydrogen gas into a melt of the metal that is to be the matrix, and causing the gas to come out of solution as bubbles upon solidification of the metallic matrix. Alternatively, hollow bodies may be incorporated into the composite as space-occupying filler material.

Reference to FIGS. 1 through 4 will help explain how the CTE of a composite material is influenced by the contributions of the CTE and elastic moduli of the reinforcement and matrix components of the composite. The Table below reports the data upon which the CTE curves were calculated.

| Property | K13710 Carbon Fiber | Al–20% Si Alloy | Si–20% Al Alloy | Si | Mg Alloy |
|---|---|---|---|---|---|
| Elastic Modulus, $E_{11}$ (GPa) | 615 | 73 | 100 | 110 | 45 |
| Elastic Modulus, $E_{22}$ (GPa) | 7.7 | | | | |
| Poisson's Ratio, $v_{12}$ | 0.27 | 0.3 | 0.3 | 0.3 | 0.3 |
| Poisson's Ratio, $v_{23}$ | 0.4 | | | | |
| Shear Modulus, $G_{12}$ (GPa) | 30 | 28 | 38 | 42 | 17 |
| CTE, $\alpha_1$ (ppm/K) | −1.38 | 20 | 7 | 2.6 | 26 |
| CTE, $\alpha_2$ (ppm/K) | 9 | | | | |

Figure 1:
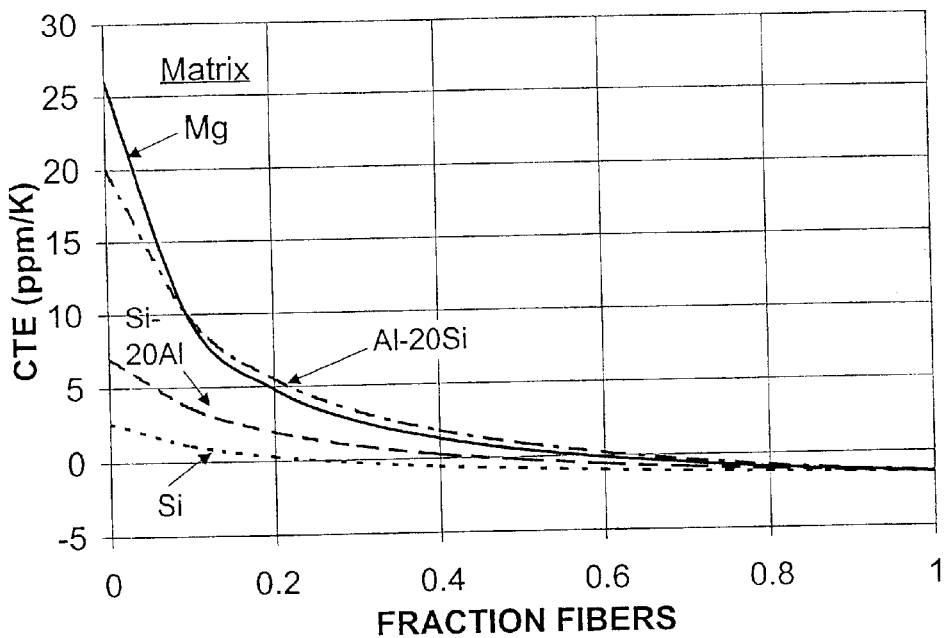
FIG. 1 is a plot of composite CTE as a function of unidirectional high modulus graphite fiber content and various matrix metals.

FIG. 1 shows calculated composite CTE values for four matrix metals as a function of fiber loading. Here, the matrix materials are considered to be substantially pure magnesium, silicon, and two aluminum-silicon alloys: Al-20Si and Si-20Al. The reinforcement is taken to be high modulus graphite fibers having a CTE of about negative 1.38 ppm/K in the direction of the fiber longitudinal axis. Here the modulus of the fiber component is about 615 GPa; however, a modulus of about 300 GPa would still be considered "high modulus." These curves reflect the case where the fibers are parallel to one another, and the composite CTE is that measured in the fiber axis direction. In this parallel fiber arrangement, the negative CTE of the fibers has a powerful "counterbalancing" effect on the (very) positive CTE of the matrix. Composite CTE values at or below about 3 ppm/K can be realized at relatively low volume fractions of fibers, for example, as low as 30 percent.

Equation 1 shows the mathematical relationship among CTE, elastic modulus, and volume fraction that is expressed by the curves in FIG. 1.

$$\text{Equation 1: } \alpha_{11} = \frac{V \cdot E_{11f} \cdot \alpha_{1f} + (1-V)E_m \cdot \alpha_m}{V \cdot E_{11f} + (1-V) \cdot E_m}$$

where:

V is the volume fraction of fibers;

$E_m$ is the elastic modulus of the matrix;

$E_{11f}$ is the elastic modulus of the fibers in the axial direction;

$\alpha_{1f}$ is the CTE of the fibers in the axial direction;

$\alpha_m$ is the CTE of the matrix; and $\alpha_{11}$ is the CTE of the composite body in the fiber axial direction.

Obviously, the larger the contributing CTE's of reinforcement and matrix, the larger the overall CTE of the composite. As Equation 1 also demonstrates, however, the CTE of the composite is related to the elastic moduli of the matrix and reinforcement phases. Moreover, this equation shows that reducing the modulus of the matrix relative to the modulus of the reinforcement reduces the CTE contribution of the matrix to the overall composite CTE, therefore causing the composite CTE to trend toward the CTE of the reinforcement. Because the CTE of the high modulus carbon fibers is negative (at least in the axial direction) while that of the matrix is positive, the averaging of the two to yield the CTE of the composite tends to produce a CTE "cancellation". Thus, it is at least theoretically possible with a proper balancing of CTE's to engineer the overall CTE of the composite to be zero.

One must bear in mind, though, that the situation described immediately above and in FIG. 1 represents the case in which the fibers are aligned. Such a composite would be highly anisotropic, and the composite CTE would be zero or near-zero only in the direction parallel to the fiber axes. In other directions, the overall CTE of the composite body would be positive and large.

An arrangement of the fibrous reinforcement that leads to a more (but not completely) isotropic composite body is the so-called "quasi-isotropic" arrangement whereby the objective is to achieve isotropy within a plane. A quasi-isotropic condition can be achieved, or at least approximated, by organizing the reinforcement fibers into sheets or "plies", and stacking the plies flat atop one another. Within each ply the axes of the fibers may be randomly arranged. In the alternative, the fibers are arranged unidirectionally within each ply, but then as the plies are placed atop one another, they are oriented such that the fibers in adjacent plies lie at specific angles with respect to one another.

Quasi-isotropic composites are similarly affected by the properties of the constituents. One major difference from the parallel fiber case, however, is in the degree of the offsetting CTE effect of the fibers, as will be evident from FIG. 2.

Figure 2:
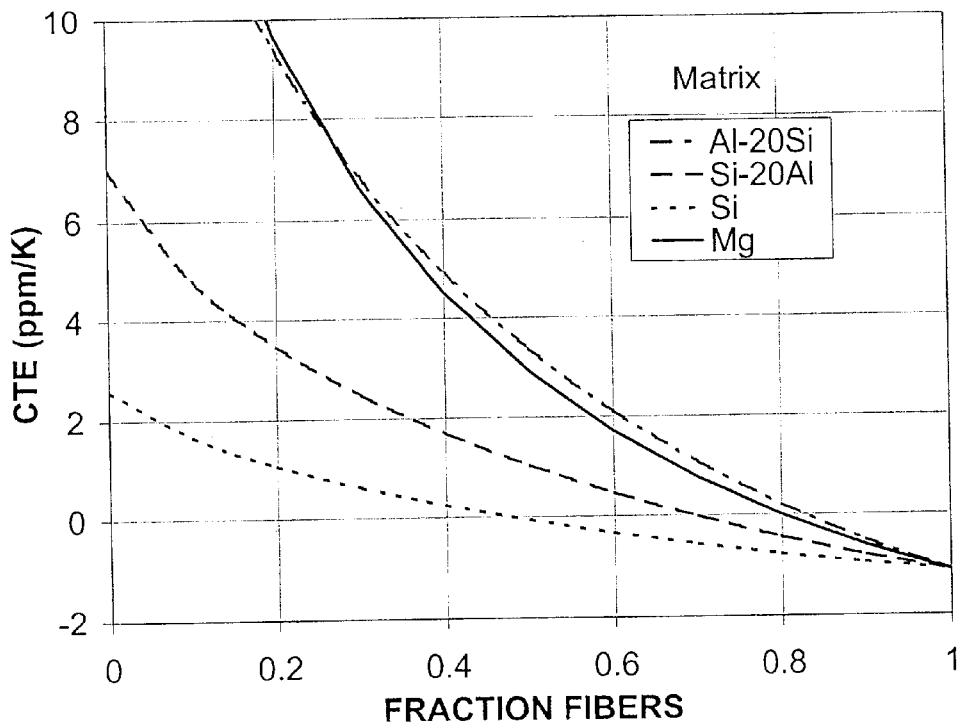
FIG. 2 is a plot of composite CTE for the same matrix metals as in FIG. 1 and as a function of fiber content in a quasi-isotropic arrangement.

Referring now to FIG. 2, what is illustrated is the case where the fibers are considered to be quasi-isotropic as, for example, by orienting successive plies of parallel fibers at 0°, +45°, −45° and 90°; or 0°, +60°, −60° with respect to one another. In this condition, the composite CTE will be approximately isotropic in the plane of the plies, but will be different (and larger) for directions not in the plane. Inspection of FIG. 2 shows that the overall CTE's of the composite body are substantially higher for the same fiber loading than in the case of unidirectional reinforcement. Stated another way, in the quasi-isotropic case, it requires a much higher fiber loading to achieve the same composite CTE than it does in the anisotropic, unidirectional case. However, the CTE's of the composite body still can be substantially lower than those of the matrix materials themselves.

The inventors appreciate that CTE itself varies as a function of temperature. Accordingly, to be most precise when stating a CTE value, the temperature or temperature range should also be specified. In the present patent document, CTE values should be assumed to pertain to the temperature range of 0 to 100° C. unless otherwise indicated.

The inventors furthermore appreciate that the terms "lower" and "higher" are rather subjective. In the context of the present invention, what is meant by a "low" CTE metal matrix composite body is one having a linear thermal expansion coefficient in the 0 to 100° C. range that is not significantly greater than about 3 or 4 ppm/K. As far as most unreinforced metals are concerned, this CTE is quite low. In the context of the present invention, materials having absolute value of CTE of about 1.0 ppm/K or less are considered "near-zero" CTE materials. There are applications that would benefit from metal composites having even lower CTE's, such as in optical components for measurement such as laser mirrors, as well as in high precision motion control systems such as for wafer and reticle motion control in semiconductor lithography. Specifically, the semiconductor manufacturing equipment industry has a need for materials whose absolute value of CTE is no greater than about 0.2 ppm/K.

In actual practice, however, zero or near-zero composite CTE is difficult if not impossible to achieve (at least in the quasi-isotropic case) using unmodified metals as the matrix material, particularly high CTE metals such as aluminum or magnesium. Referring again to the Table, one can gain a sense of why such a high fiber loading would be required where the CTE of the matrix metal is on the order of 20 ppm/K or more, and that of the graphite fibers is only on the order of −1 to −2 ppm/K. A review of FIG. 2 bears this fact out, showing that fiber loadings in excess of 70 volume percent would be required to achieve a composite CTE of 1 ppm/K or less where the matrix is magnesium or aluminum/20 wt % silicon.

A review of Equation 1 can provide an approach for reducing the influence of matrix materials such as metals whose CTE may overwhelm the CTE of the fibers. Specifically, if the elastic modulus of the matrix can be reduced relative to that of the fibers, then the CTE of the composite will be less influenced by the matrix contribution, and more dominated by the fiber contribution.

One strategy for reducing the elastic modulus of the matrix is to select only relatively low elastic materials as candidate matrix materials, e.g., polymers. This approach, however, excludes many materials that might otherwise possess desirable properties, for example, high thermal conductivity metals such as aluminum.

A better approach might be to work with the desired matrix metal, and find ways to reduce its elastic modulus. One such technique, and specifically a technique that the present inventors advocate, is to introduce pores or voids into the material making up the matrix. Preferably, the pores are closed so as not to expose the interior of the composite material to potentially corrosive external environments. Closed pores would also not inhibit evacuation in vacuum environments. The pores should be small and uniformly distributed throughout the matrix.

Figure 3:
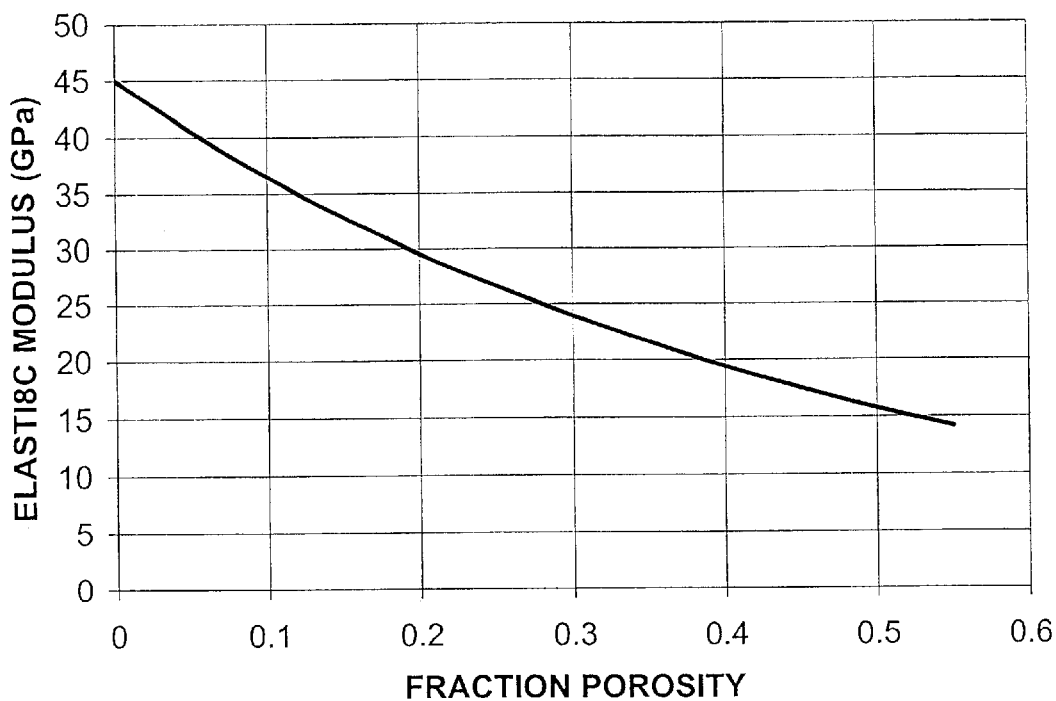
FIG. 3 is a plot of elastic modulus as a function of porosity for magnesium.

FIG. 3 is a plot of the mathematical relationship between porosity and the physical property of elastic modulus. Here, the material being presented is magnesium, but the relationship holds for any isotropic material. This graph assumes closed, spherical pores evenly distributed throughout the body. To take one point as an example, one can see that 33 percent porosity reduces the elastic modulus by about 50 percent. For flatter pores, the effect is even greater. Equation 2 illustrates the more comprehensive mathematical relationship among the pore-free elastic modulus $E_o$, pore fraction $f_p$, pore shape coefficient b, and the resulting elastic modulus E.

$$E = E_o \exp(-b\, f_p) \qquad \text{Equation 2}$$

Figure 4:
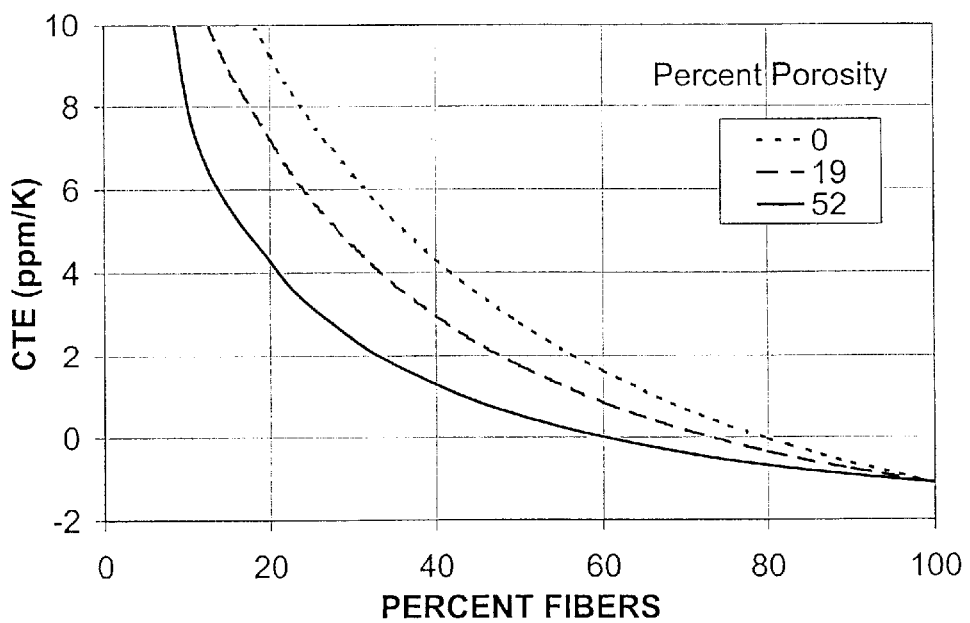
FIG. 4 is a plot of composite CTE as a function of fiber content for various degrees of porosity in quasi-isotropic magnesium matrix composite.

FIG. 4 shows the effect of this porosity on the composite CTE curves as a function of high modulus carbon fiber content (in the quasi-isotropic arrangement) with magnesium as the matrix. At 50 volume percent fiber loading and no porosity, the composite CTE is about 3 ppm/K. Introducing about 19 percent porosity into the matrix brings the composite CTE to below 2 ppm/K. If 60 percent loading can be achieved, a 52 percent porous matrix will yield a magnesium matrix composite body having essentially zero CTE. This result is rather remarkable given that the CTE of unreinforced magnesium is about 26 ppm/K.

There are a number of ways to intentionally introduce pores into the matrix material. For example, the composite may be processed using powder metallurgical techniques. More specifically, the matrix may be added to the fibers or placed between fiber plies in finely divided form (e.g., as a powder), and the admixture incompletely sintered to produce a porous, reticulated matrix. Additionally, one or more fugitive materials may be added to the finely divided matrix metal prior to sintering such that during subsequent heating and partial sintering, the fugitive material burns out or volatilizes, and each body of fugitive material leaves behind a pore.

For metal matrix composite materials made by infiltrating molten metal into a porous, metal permeable body of reinforcement material, the propensity for dissolved gasses to come out of solution and create bubbles upon solidification of the metal may be employed to advantage. One such gas that exhibits this characteristic, particularly with aluminum melts, is hydrogen. In fact, hydrogen is normally thought of as a nuisance substance in aluminum casting procedures, and foundry workers usually take precautions (e.g., vacuum degassing) to avoid hydrogen entrapment in their melts to be cast. In certain applications, a little hydrogen may be beneficial, for example, by reducing somewhat the amount of solidification shrinkage of an aluminum casting. The hydrogen contamination typically arises from exposure to water vapor, and merely exposing a melt of aluminum to an ambient, moist air atmosphere for any appreciable amount of time will result in the uptake of hydrogen by the melt. Where hydrogen gas is to be added deliberately to an aluminum melt, the traditional approach was to add a slice of apple or potato to the molten metal. Those familiar with modern aluminum foundry techniques are aware of commercially available metal treatment products for this purpose.

Still further, pores may be incorporated into the matrix by infiltrating the molten matrix metal into a permeable mass or preform containing the graphite fibers and hollow bodies of filler material such as alumina "microspheres." In one embodiment, the high modulus graphite fibers are arranged quasi-isotropically, and the assemblage of fibers is then constrained or clamped around the periphery thereof, as for example, by a refractory frame structure. This assembly is then immersed into a slurry containing the microspheres, thereby depositing microspheres between the fibers. After thoroughly drying the liquid vehicle of the slurry, molten matrix metal is then caused to infiltrate the permeable mass, thereby embedding both the graphite fibers and the alumina microspheres.

The ideal candidate molten metal would wet but not react with the carbon fibers. Unfortunately, this is not generally the situation with the candidate metals of interest. Thus, the next-best choice of a matrix metal is one that, while not wetting the reinforcement, at least does not react with the fibers. Then, while the application of pressure or vacuum may be required to distribute the metal among the fibers to form a composite body, at least the fibers are not chemically degraded by the metallic matrix. Pressure infiltration techniques, while cumbersome and costly, at least are well-known and widely practiced in the metal composites art.

While some high thermal conductivity candidate matrix metals do not react with carbon (e.g., magnesium and copper), other metals such as silicon and aluminum do react. (Strictly speaking, silicon is a semimetal, but in the context of the present invention, silicon will be considered to be a metal.) Aluminum, for example, reacts with carbon to form aluminum carbide. Not only does this represent a chemical degradation of the graphite reinforcement fibers, but also aluminum carbide is hygroscopic. The chemical conversion of aluminum carbide to aluminum hydrate from exposure to water (such as water vapor) produces acetylene gas plus a large positive volume change that can cause cracking in the composite body.

Therefore, one or more coatings may be placed onto the carbon fibers to protect the fibers from being corroded by these reactive matrix metals and/or permit the metal (e.g., aluminum) to wet the reinforcement. Wetting of the metal to the reinforcement may improve the mechanical properties of the resulting metal composite, and the wetting condition may also permit the metal to infiltrate a porous mass of the reinforcement material without the need to force the molten metal in under pressure, or to pull it in under applied vacuum. For silicon or silicon alloy melts, a desirable coating is silicon carbide, and a widely known technique for depositing a coating of silicon carbide onto carbon fibers is by chemical vapor deposition (CVD).

Molten silicon readily wets silicon carbide, and such a molten material can spontaneously wick into a porous mass of silicon carbide without the need to draw the molten silicon in under vacuum or to force it in under pressure. The infiltration works best in a vacuum atmosphere and when the permeable mass contains some elemental carbon that is available to react chemically with the molten silicon.

Commonly Owned U.S. Provisional Patent Application No. 60/145299 discloses that aluminum may be alloyed with the silicon in amounts ranging from about 0.1 percent by weight or less up to about 90 percent. The resulting alloy will still pressurelessly infiltrate into a permeable mass of reinforcement material containing some interconnected carbon to form a reaction bonded silicon carbide composite body. The alloy generally does not need to be heated to a temperature greater than about 100° C. above the liquidus temperature. If the body to be infiltrated contains no elemental carbon, however, the process may have to be carried out at higher temperatures, for example, in the 1600° C. to 1800° C. range. The entire disclosure of this Commonly Owned Patent Application is hereby incorporated by reference.

Thus, to prepare a silicon or silicon alloy matrix composite according to the present invention, one would first coat the high modulus graphite fibers with, for example, silicon carbide, thereby preventing direct contact with the molten metal during infiltration. It would then be desirable to add about 1 to 10 percent by weight of elemental carbon to the coated fibers so as to be able to conduct the infiltration near the liquidus temperature. One means of accomplishing this carbon addition is to soak the preform in a carbonaceous resin such as furfuryl alcohol, then pyrolyze the resin in a non-oxidizing atmosphere to decompose the resin to essentially elemental carbon. The preform and alloy are then placed into a vacuum furnace, and the chamber is pumped down (a roughing pump is sufficient). When the preform is contacted to the molten silicon or silicon alloy, infiltration occurs within a few minutes.

The following examples illustrate with still more specificity several preferred embodiments of the present invention. These examples are meant to be illustrative in nature and should not be construed as limiting the scope of the invention.

EXAMPLE 1

This example demonstrates how a high modulus graphite fiber reinforced magnesium composite might be produced according to the present invention.

Plies of parallel graphite fibers are supplied as "prepregs."

In accordance with the teachings of U.S. Pat. No. 3,888,661 to Levitt, the plies are then "dusted" with titanium metal particulate having an average particle size of about 44 microns. During subsequent processing, the titanium will help the magnesium to wet and bond to the graphite fibers. In addition, as the fiber plies are assembled, each ply is "salted" with a layer of magnesium filings.

The plies are then arranged quasi-isotropically in a refractory mold. In particular, if the orientation of the first ply is taken to be 0°, then the second ply is placed flat on top of the first ply such that it is oriented +45° with respect to the first ply. The third ply is then placed flat on top of the second ply and oriented −45° with respect to the first ply. The fourth and fifth plies are then placed flat on top of the third ply and oriented +90° with respect to the first ply. The sixth ply is then placed flat on top of the fourth ply and oriented −45° with respect to the first ply. The seventh ply is placed flat on top of the fifth ply and oriented +45° with respect to the first ply. Finally, the eighth ply is placed flat on top of the sixth ply and oriented in parallel (0°) with respect to the first ply, thereby completing the lay-up.

The temporary binder holding the graphite fibers in fixed relation to one another is then removed by dissolving in an organic solvent such as acetone or methylethyl ketone.

After drying to remove all traces of the solvent, the lay-up is then contacted with a source of molten magnesium at a temperature in the range of about 725° C. to about 800° C. in an inert gas atmosphere. The magnesium previously has been inoculated with hydrogen. No more than modest pressure (e.g., less than 700 kPa) should be needed to cause the molten magnesium to infiltrate the carbon fiber plies.

Upon completion of infiltration, the magnesium matrix composite body is solidified in a controlled manner so as to cause the dissolved hydrogen to come out of solution as tiny hydrogen gas bubbles. In particular, the composite body should be solidified omnidirectionally with slow cooling through the melting temperature.

EXAMPLE 2

The procedures of Example 1 are repeated, except that the teachings of U.S. Pat. No. 4,056,874 to Kalnin should obviate the need for adding magnesium filings and titanium particulate wetting agent between the fiber plies. Instead, about 5 to 10 percent by weight of magnesium nitride is added to the magnesium melt, thereby permitting the molten magnesium to wet and infiltrate the carbon fibers on contact in a gaseous nitrogen atmosphere. Such a melt can be obtained by exposing a crucible of molten magnesium at a temperature of about 840 to 850° C. to an atmosphere of gaseous nitrogen for about 40 minutes. Magnesium nitride solid will form on the surface of the melt, and this reaction product then may be readily dispersed in the magnesium melt.

EXAMPLE 3

A quasi-isotropic lay-up is assembled as in Example 1, but without the magnesium filings or titanium particulate. After removing the temporary binder, a protective coating of silicon carbide is deposited onto the graphite fibers, for example, by chemical vapor deposition, thereby completing the lay-up. The lay-up is placed into a vacuum furnace. The furnace chamber is evacuated to less than about 100 millitorr, and heated to a temperature of about 1300° C. Upon contacting the coated fibers with a matrix metal comprising about Si-50Al, the molten metal is spontaneously wicked into the mass of coated fibers to form a composite body.

INDUSTRIAL APPLICABILITY

The methods and compositions of the present invention find utility in applications requiring high specific stiffness, low thermal expansion coefficient, high hardness, high toughness, high thermal conductivity and/or high wear resistance.

The present invention for making low or near-zero CTE metal matrix composite materials finds utility in the precision equipment, robotics, tooling, aerospace, electronic packaging and thermal management, and semiconductor fabrication industries, among others. In addition to desirable low CTE attributes, the carbon fiber metal matrix composites of the present invention may also provide high specific stiffness and high thermal conductivity. Accordingly, specific articles of manufacture contemplated by the present invention include semiconductor wafer handling devices, vacuum chucks, electrostatic chucks, air bearing housings or support frames, electronic packages and substrates, machine tool bridges and bases, optical bench components, mirror substrates, mirror stages and flat panel display setters.

An artisan of ordinary skill will appreciate that various modifications may be made to the invention herein described without departing from the scope or spirit of the invention as defined in the appended claims.

What is claimed is:

1. A metal matrix composite material, comprising:
    a reinforcement phase comprising a plurality of fibers having a negative thermal expansion coefficient at least in a longitudinal direction of said fibers;
    a matrix phase comprising at least one metal permeating said reinforcement phase;
    a porosity phase distributed throughout said matrix phase, said porosity phase making up at least 19 percent of an apparent volume of said matrix phase; and
wherein said metal matrix composite material has a coefficient of thermal expansion less than about 3 parts per million per degree Kelvin.

2. The metal matrix composite material of claim 1, comprising at least 30 percent by volume of said fibers.

3. The metal matrix composite material of claim 1, wherein said reinforcement phase is present as at least one sheet or ply, and said thermal expansion coefficient is quasi-isotropic within the plane of said sheet or ply.

4. The metal matrix composite material of claim 1, wherein said reinforcement phase is present as at least one sheet or ply comprising said fibers randomly arranged within the plane of said sheet or ply.

5. The metal matrix composite material of claim 1, wherein said matrix metal comprises at least one metal selected from the group consisting of aluminum, copper, magnesium, silicon and silver.

6. The metal matrix composite material of claim 1, further comprising an interfacial material disposed between said fibers and said metal of said matrix phase, and substantially completely isolating said fibers from direct contact with said metal.

7. The metal matrix composite material of claim 6, wherein said interfacial material comprises silicon carbide in the form of a coating deposited on said fibers.

8. The metal matrix composite material of claim 1, wherein said fibers comprise high elastic modulus carbon fibers.

9. The metal matrix composite material of claim 8, wherein said high elastic modulus carbon fibers have an average tensile modulus of at least about 300 GPa.

10. The metal matrix composite material of claim 3, wherein said matrix metal comprises silicon and about 0.1 to about 90 percent aluminum by weight; and said reinforcement phase comprises a plurality of said sheets or plies arranged substantially flat atop one another, each of said sheets or plies comprising a plurality of substantially parallel carbon fibers.

11. A composite material, comprising:
    a matrix phase comprising at least one metal;
    a reinforcement phase comprising a plurality of fibers having a negative thermal expansion coefficient at least in a longitudinal direction of said fibers;
    a porosity phase, wherein said reinforcement phase and said porosity phase are distributed throughout said matrix phase; and
    further wherein said metal matrix composite material has a coefficient of thermal expansion less than about 3 parts per million per degree Kelvin, and still further wherein said coefficient of thermal expansion is quasi-isotropic within at least one plane.

12. The composite material of claim 11, wherein said reinforcement phase is present as at least one ply, and said thermal expansion coefficient is quasi-isotropic within the plane defined by said at least one ply.

13. The composite material of claim 11, wherein said matrix metal comprises at least one metal selected from the group consisting of aluminum, copper, magnesium, silicon and silver.

14. The composite material of claim 11, wherein said fibers comprise high elastic modulus carbon fibers.

15. The composite material of claim 11, wherein said porosity phase is substantially uniformly distributed throughout said matrix phase.

16. The composite material of claim 11, wherein said porosity phase is substantially closed to an environment external to said composite material.

17. The composite material of claim 11, wherein said porosity phase makes up at least 19 percent by volume of the sum of the true volumes of said porosity and matrix phases.

18. The composite material of claim 11, wherein said fibers are provided in the form of a plurality of plies stacked flat atop one another, and further wherein said fibers are substantially unidirectional within a ply, and further wherein said plies are oriented with respect to one another as to produce a quasi-isotropic coefficient of thermal expansion within the plane defined by a ply.

19. The composite material of claim 12, wherein said fibers are randomly arranged within said plane.

20. The composite material of claim 12, wherein said quasi-isotropic condition is achieved by orienting said plies at angles of +45 degrees, −45 degrees and 90 degrees with respect to a reference ply.

21. The composite material of claim 12, wherein said quasi-isotropic condition is achieved by orienting said plies at angles of +60 degrees and −60 degrees with respect to a reference ply.

22. The composite material of claim 3, wherein said quasi-isotropic condition is achieved by orienting said plies at angles of +45 degrees, −45 degrees and 90 degrees with respect to a reference ply.

23. The composite material of claim 3, wherein said quasi-isotropic condition is achieved by orienting said plies at angles of +60 degrees and −60 degrees with respect to a reference ply.

* * * * *